(12) United States Patent
Liu et al.

(10) Patent No.: US 10,689,258 B2
(45) Date of Patent: Jun. 23, 2020

(54) METHOD FOR MAKING CARBON NANOTUBE ARRAY

(71) Applicants: Tsinghua University, Beijing (CN); HON HAI PRECISION INDUSTRY CO., LTD., New Taipei (TW)

(72) Inventors: Liang Liu, Beijing (CN); Qi Cai, Beijing (CN); Qiu-Qiu Zheng, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 199 days.

(21) Appl. No.: 15/990,961

(22) Filed: May 29, 2018

(65) Prior Publication Data

US 2018/0354803 A1    Dec. 13, 2018

(30) Foreign Application Priority Data

Jun. 7, 2017  (CN) .......................... 2017 1 0424233

(51) Int. Cl.
*C01B 32/162* (2017.01)
*B82B 3/00* (2006.01)
(Continued)

(52) U.S. Cl.
CPC ........ *C01B 32/162* (2017.08); *B81C 1/00031* (2013.01); *B82B 3/0004* (2013.01); *B82Y 30/00* (2013.01); *B82Y 40/00* (2013.01); *C01B 2202/06* (2013.01); *C01B 2202/20* (2013.01)

(58) Field of Classification Search
CPC .............. C01B 32/162; C01B 2202/06; C01B 2202/20; B82Y 30/00; B82Y 40/00
See application file for complete search history.

(56) References Cited

U.S. PATENT DOCUMENTS 7,615,205 B2 * 11/2009  Jiang ..................... B82Y 30/00
                                                              423/447.3
2007/0048211 A1    3/2007  Jiang et al.
(Continued)

FOREIGN PATENT DOCUMENTS

CN        104418318 A  *  3/2015
JP        2012057206 A  *  3/2012
(Continued)

OTHER PUBLICATIONS

Wang, Miao, et al. "Wafer-scale transfer of vertically aligned carbon nanotube arrays." Journal of the American Chemical Society 136.52 (2014): 18156-18162.*

(Continued)

*Primary Examiner* — Richard M Rump
(74) *Attorney, Agent, or Firm* — ScienBiziP, P.C.

(57) ABSTRACT

A method for making a carbon nanotube array includes providing a substrate having a first substrate surface and a second substrate surface opposite to the first substrate surface. The substrate has a plurality of through holes spaced from each other, and each of the plurality of through holes extends from the first substrate surface to the second substrate surface. A catalyst layer is deposited on the first substrate surface, to form a composite structure. The composite structure is placed in a chamber. The carbon source gas and protective gas are supplied to the chamber, and the composite structure is heated to a first temperature, to grow a carbon nanotube array on the first substrate surface.

20 Claims, 11 Drawing Sheets

(51) Int. Cl.
  *B81C 1/00* (2006.01)
  *B82Y 40/00* (2011.01)
  *B82Y 30/00* (2011.01)

(56) References Cited

U.S. PATENT DOCUMENTS

| | | |
|---|---|---|
| 2011/0135894 A1 | 6/2011 | Liu et al. |
| 2013/0189432 A1* | 7/2013 | Nakashima ............. C23C 16/26 427/249.1 |
| 2013/0295320 A1 | 11/2013 | Liu et al. |

FOREIGN PATENT DOCUMENTS

| | | |
|---|---|---|
| TW | I313670 | 8/2009 |
| TW | 201125816 A | 8/2011 |
| TW | 201345830 A | 11/2013 |

OTHER PUBLICATIONS

English machine translation of CN104418318A (2015).*
Banerjee, D., A. Jha, and K. K. Chattopadhyay. "Efficient field emission from coiled carbon nano/microfiber on copper substrate by dc-PECVD." Applied Surface Science 256.24 (2010): 7516-7521.*
Li Qingwen et al., Defect Location of Individual Single-Walled Carbon Nanotubes with a Thermal Oxidation Strategy, J. Phys. Chem. B, Oct. 4, 2002, 11085-11088, 106(43).
Michael Q. Tran et al., Thermal Oxidative Cutting of Multi-Walled Carbon Nanotubes, Carbon, Aug. 1, 2007, 2341-2350, 45(12).
Yo-Sep Min et al., Ruthenium Oxide Nanotube Arrays Fabricated by Atomic Layer Deposition Using a Carbon Nanotube Template, Advanced Materials, Jun. 17, 2003,1019-1022, vol. 15/Iss.12.

* cited by examiner

METHOD FOR MAKING CARBON NANOTUBE ARRAY

CROSS-REFERENCE TO RELATED APPLICATIONS

This application is related to commonly-assigned application entitled, "METHOD FOR MAKING CARBON NANOTUBE ARRAY", concurrently filed; "METHOD FOR SEPARATING CARBON NANOTUBE ARRAY FROM GROWTH SUBSTRATE", concurrently filed; "DEVICE FOR MAKING CARBON NANOTUBE ARRAY", concurrently filed. Disclosures of the above-identified applications are incorporated herein by reference.

FIELD

The present application relates to a method for making a carbon nanotube array and devices for making the carbon nanotube array.

BACKGROUND

Carbon nanotubes can be composed of a number of coaxial cylinders of graphite sheets, and have recently attracted a great deal of attention for use in different applications, such as field emitters, chemical sensors, and so on. The carbon nanotubes can be prepared by Chemical Vapor Deposition (CVD), Arc Discharge, or Laser Ablation. When a carbon nanotube array is grown on a growth substrate by the CVD method, the carbon nanotube array adheres to the growth substrate and it is difficult to separate the carbon nanotube array from the growth substrate. Furthermore, it is difficult to obtain an integrated carbon nanotube array by peeling the carbon nanotube array from the growth substrate using a knife or a tweezer, because the bonding force between the carbon nanotubes and the growth substrate is strong.

What is needed, therefore, is to provide a method for making a carbon nanotube array and devices for making the carbon nanotube array that can overcome the above-described shortcomings.

Therefore, there is room for improvement in the art.

BRIEF DESCRIPTION OF THE DRAWINGS

Implementations of the present technology will now be described, by way of example only, with reference to the attached figures, wherein.

DETAILED DESCRIPTION

Figure 1:
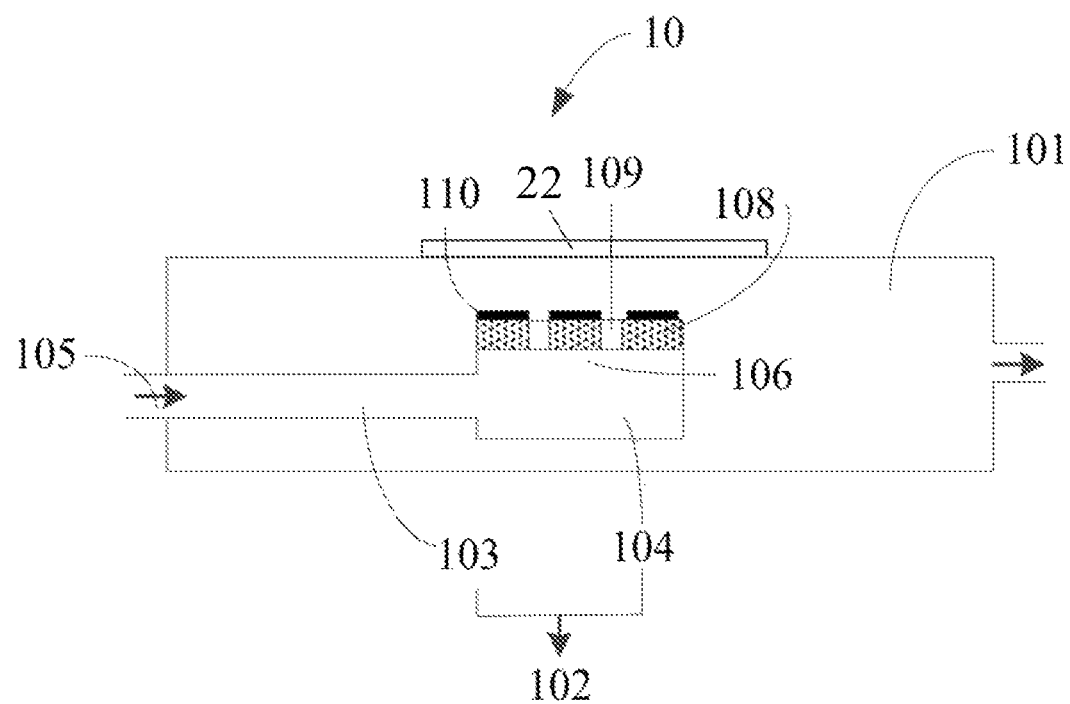
FIG. 1 is a schematic view of a first embodiment of a device for making a carbon nanotube array.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to illustrate details and features better. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Referring to FIG. 1, a device 10 for making a carbon nanotube array in a first embodiment includes a chamber 101, a gas supplying element 102 located in the chamber 101, and a heater 22 used for heating the chamber 101. The gas supplying element 102 includes a gas supplying pipe 103 and a gas diffusing unit 104 connected to the gas supplying pipe 103.

The chamber 101 can be formed by a material with stable chemical properties and high temperature resistance. In one embodiment, the chamber 101 is defined by a quartz tube. A flowmeter can be installed in the chamber 101 to detect the flow of gas, or a piezometer can be installed in the chamber 101 to detect the pressure of the chamber 101. The chamber 101 can be connected to a vacuum pump to reduce the pressure in the chamber 101. The chamber 101 has an inlet opening and an outlet opening.

The gas supplying pipe 103 is used for supplying gas to the gas diffusing unit 104. The gas supplying pipe 103 has two opposite ends, one end of the gas supplying pipe 103 is in the chamber 101 and connected to the gas diffusing unit 104, the other end of the gas supplying pipe 103 is defined as an inlet 105 and extends out of the chamber 101. The connection manner between the gas supplying pipe 103 and the gas diffusing unit 104 is not limited, as long as gas can be supplied or diffused from the gas supplying pipe 103 to the gas diffusing unit 104. The gas supplying pipe 103 can be integrated with the gas diffusing unit 104. The gas supplying pipe 103 can also be detachably connected to the gas diffusing unit 104.

Figure 4:
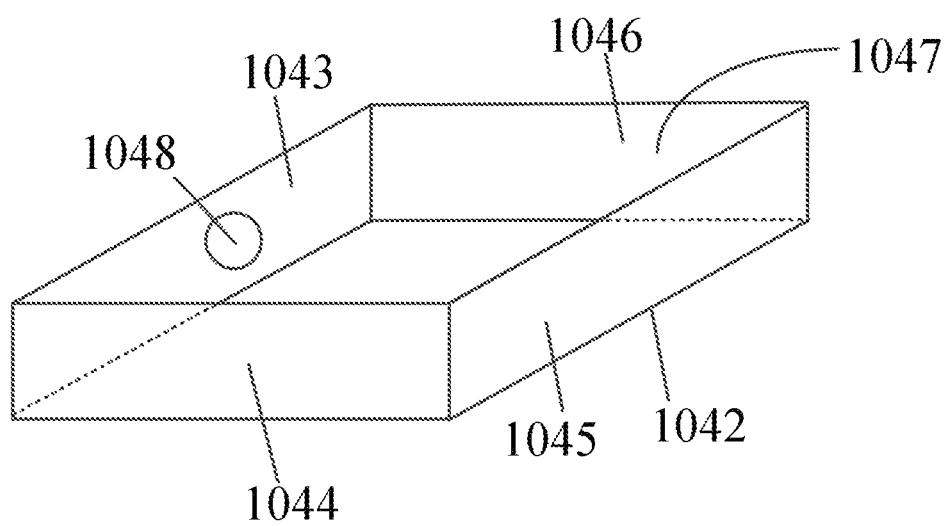
FIG. 4 is a schematic view of the first embodiment of a gas supplying element.
Figure 5:
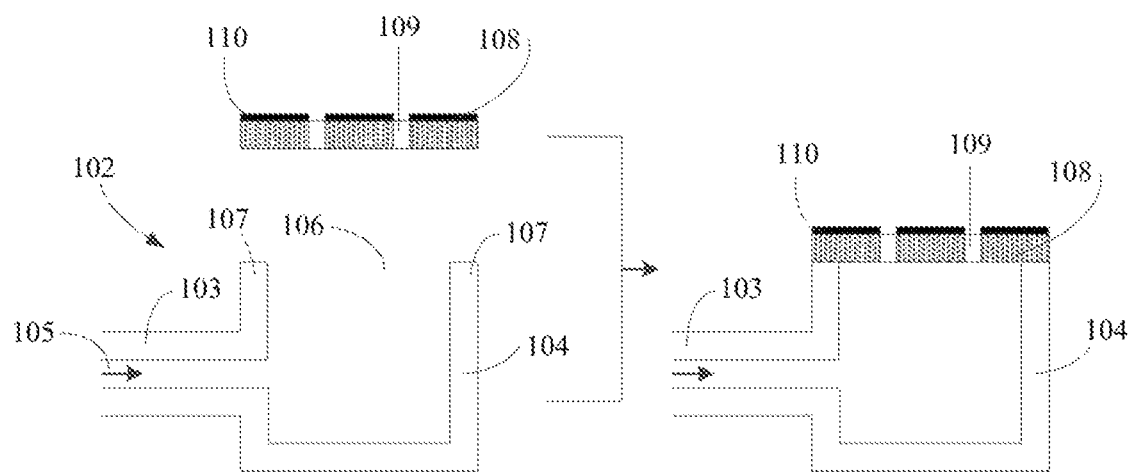
FIG. 5 is a schematic view of the first embodiment of connecting the gas supplying element with a substrate.

The gas diffusing unit 104 is used for supporting a substrate 108 and diffusing the gas to the chamber 101. The gas diffusing unit 104 is away from the inlet 105 and in the chamber 101. Referring to FIGS. 4 and 5, the gas diffusing unit 104 is a hollow structure and includes a bottom wall 1042 and a sidewall 107. The sidewall 107 defines a hole 1048, and the gas supplying pipe 103 can be inserted into the hole 1048. The gas diffusing unit 104 defines a space 1047 and an outlet 106, and the outlet 106 is opposite to the bottom 1042. The sidewall 107 and the bottom 1042 define the space 1047. The sidewall 107 can form a cube, a circle, or a trapezoid. Thus, the shape of the gas diffusing unit 104 is not limited. In one embodiment, the shape of the gas diffusing unit 104 is cubic. As shown in FIG. 4, the sidewall 107 includes a first sidewall 1043, a second sidewall 1045 opposite to the first sidewall 1043, a third sidewall 1044, and a fourth sidewall 1046 opposite to the third sidewall 1044. The first sidewall 1043 defines the hole 1048, and the gas supplying pipe 103 inserted into the hole 1048. The bottom wall 1042, the first sidewall 1043, the second sidewall 1045, the third sidewall 1044, and the fourth sidewall 1046 encircle the space 1047. The first sidewall 1043, the second sidewall 1045, the third sidewall 1044, and the fourth sidewall 1046 form a cube. Thus, the shape of the gas diffusing unit 104 is cubic. The gas from the inlet 105 passes through the gas supplying pipe 103 and the gas diffusing unit 104 to enter the inside of the chamber 101. The gas enters the inside of the chamber 101 from the outlet 106 of the gas diffusing unit 104. Referring to FIG. 5, the sidewall 107 is used for supporting the substrate 108. The gas diffusing unit 104 can be a semi-closed container. In one embodiment, the gas diffusing unit 104 is a quartz boat.

Figure 2:
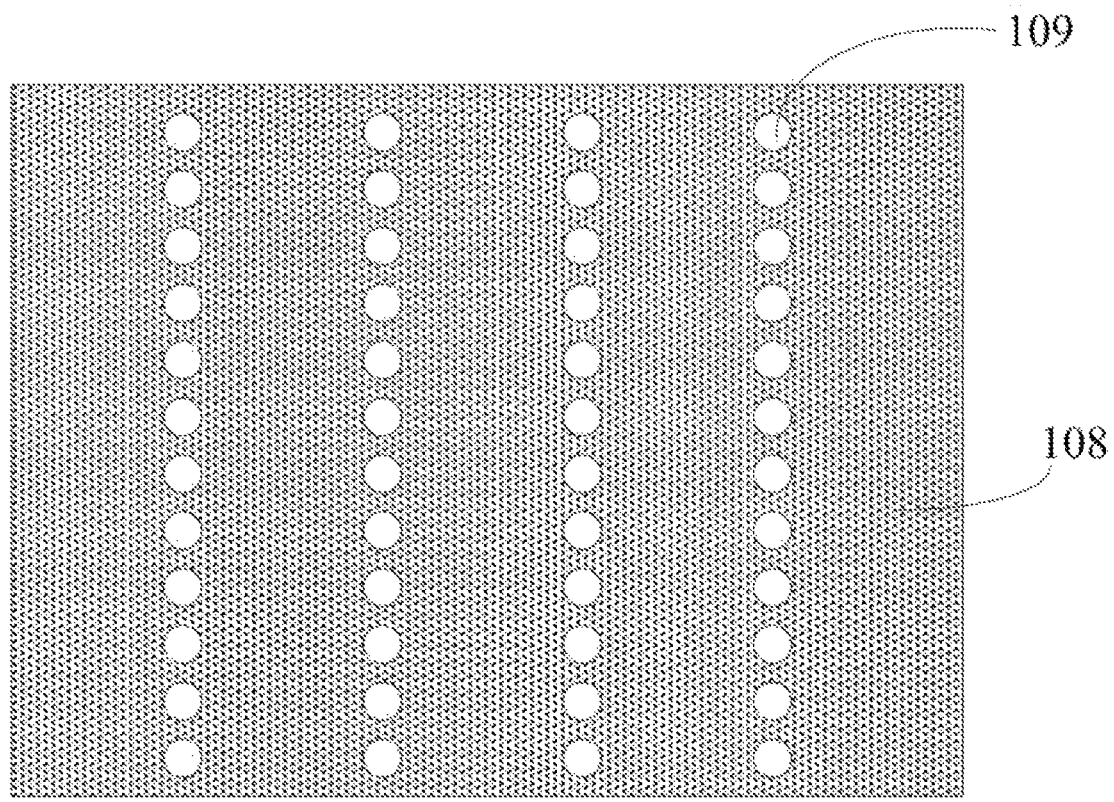
FIG. 2 is a schematic view of the first embodiment of a substrate.
Figure 3:
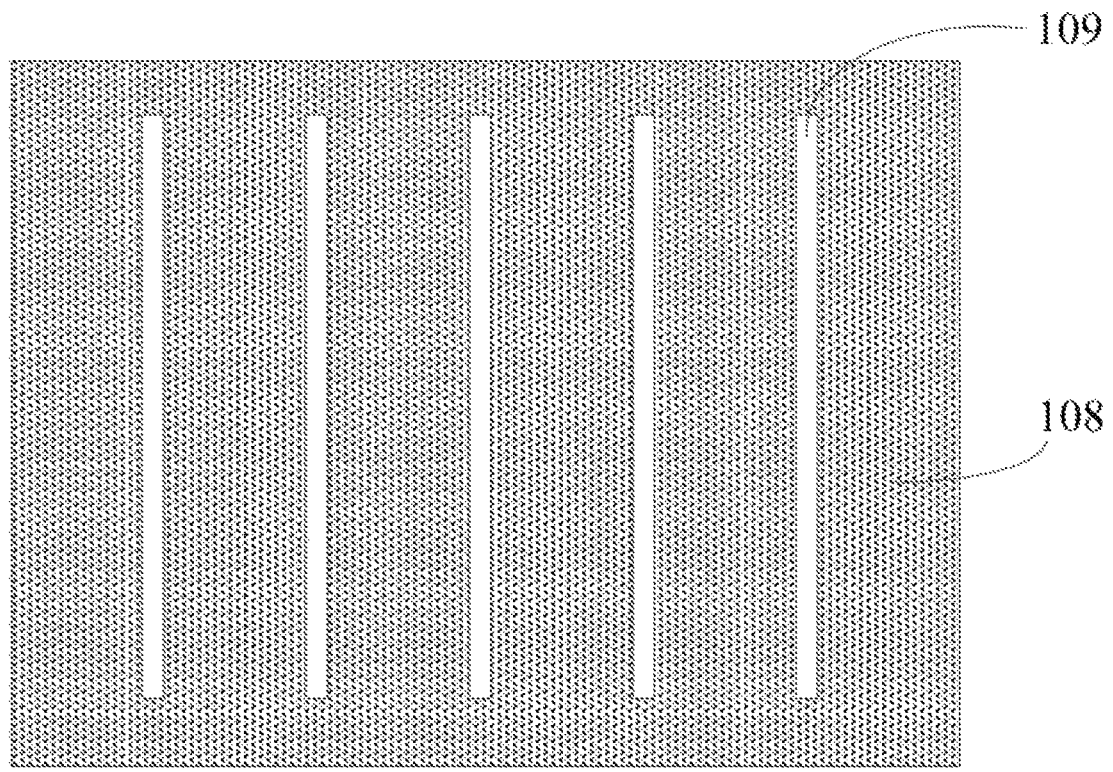
FIG. 3 is a schematic view of the first embodiment of another substrate.

The substrate 108 is suspended on the outlet 106 of the gas diffusing unit 104. The substrate 108 can be stuck on the sidewall 107 of the gas diffusing unit 104 by an adhesive. The substrate 108 defines a plurality of through holes 109. The shape of each through hole 109 is not limited, such as circle, square, triangle, diamond, or rectangle. The shapes of the plurality of through holes 109 can be different from each other. Each through hole 109 can be a circular hole, as shown in FIG. 2. The diameter of the circular hole is in a range from about 10 nanometers to about 1 centimeter. Each through hole 109 can be a strip hole, as shown in FIG. 3. The width of the strip hole is in a range from about 10 nanometers to about 1 centimeter. When the substrate 108 is located on the gas diffusing unit 104, the gas in the gas diffusing unit 104 can enter inside of the chamber 101 by passing through the outlet 106 of the gas diffusing unit 104 and the through holes 109 of the substrate 108.

The heater can be formed by carbon nanotubes or electrothermal resistance wires surrounding the periphery of the chamber 101 to heat the chamber 101, so that the substrate 108 is heated. The heater can also be a high-frequency furnace or a laser heater, to only heat the substrate 108. For example, the heater is disposed above or below the gas diffusing unit 104, only to heat the substrate 108 without heating the entire chamber 101, thereby saving energy.

Figure 6:
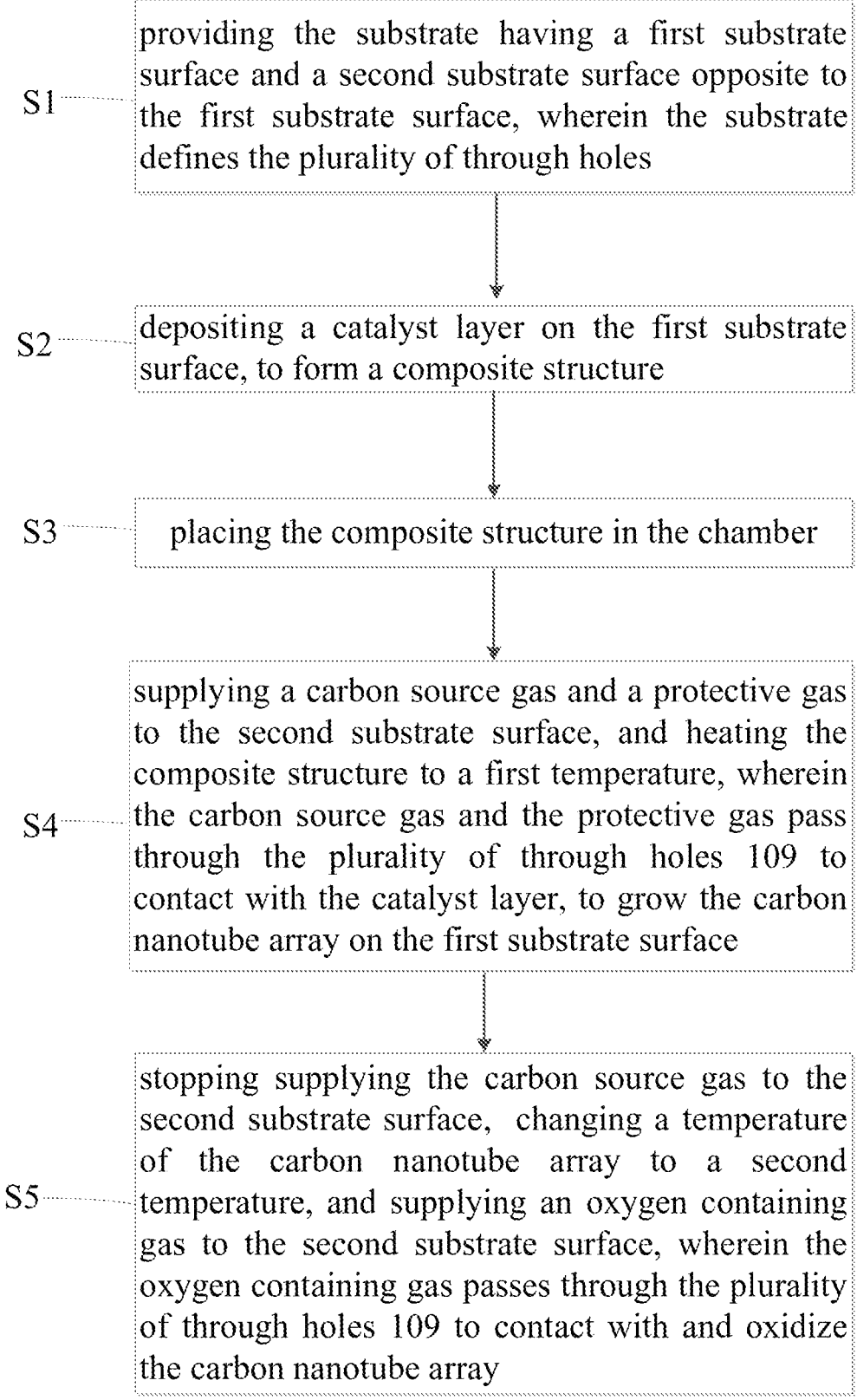
FIG. 6 is a schematic process flow of the first embodiment of a method for making the carbon nanotube array by using the device of FIG. 1.

Referring to FIG. 6, a method for making a carbon nanotube array by the device 10 of FIG. 1 includes one or more of the following steps:

S1, providing the substrate 108 having a first substrate surface and a second substrate surface opposite to the first substrate surface, wherein the substrate 108 defines the plurality of through holes 109;

S2, depositing a catalyst layer 110 on the first substrate surface, to form a composite structure;

S3, placing the composite structure in the chamber 101;

S4, supplying a carbon source gas and a protective gas to the second substrate surface, and heating the composite structure to a first temperature, wherein the carbon source gas and the protective gas pass through the plurality of through holes 109 to contact with the catalyst layer, to grow the carbon nanotube array on the first substrate surface; and S5, stopping supplying the carbon source gas to the second substrate surface, changing a temperature of the carbon nanotube array to a second temperature, and supplying an oxygen containing gas to the second substrate surface, wherein the oxygen containing gas passes through the plurality of through holes 109 to contact with and oxidize the carbon nanotube array.

During step S1, the substrate 108 is resistant to high temperature, does not react with the carbon source gas and the protective gas, and does not undergo atomic permeation. The material of the substrate 108 can be silicon, quartz, or the like. In one embodiment, the substrate 108 is a silicon wafer, a protective layer is formed on the silicon wafer, for example, the protective layer is a silicon oxide layer, and the thickness of the silicon oxide layer ranges from about 1 nanometer to about 1000 nanometers. The first substrate surface can be treated by mechanical polishing or electrochemical polishing, to ensure the smoothness of the first substrate surface to meet the needs of growing the carbon nanotube array. Each of the plurality of through holes 109 extends from the first substrate surface to the second substrate surface.

During step S2, the thickness of the catalyst layer 110 ranges from about 1 nanometer to about 10 nanometers. In one embodiment, the thickness of the catalyst layer 110 ranges from about 1 nanometer to about 5 nanometers. The catalyst layer 110 can be formed on the first substrate surface by evaporation, sputtering, or chemical deposition. The material of the catalyst layer 110 can be iron, cobalt, nickel, or an alloy of any combination thereof. The catalyst layer 110 can further be annealed, the annealing temperature ranges from about 200 degrees Celsius to about 400 degrees Celsius, and the annealing time ranges from about 8 hours to about 12 hours. After annealing the catalyst layer 110 under an air atmosphere, the catalyst layer 110 can be oxidized to form metal oxide, and the catalyst layer 110 can become uniformly distributed metal oxide catalyst nanoparticles. The catalytic activity of the catalyst nanoparticles is better than the catalytic activity of the continuous catalyst layer 110. In one embodiment, the material of the catalyst layer 110 is iron, the thickness of the iron catalyst layer 110 is about 2 nanometers, and the iron catalyst layer 110 is annealed at 300 degrees Celsius for 10 hours under the air atmosphere.

If the catalyst layer 110 is deposited on the first substrate surface, the metal of the catalyst layer 110 may react with the silicon of the first substrate surface to form an alloy, and this alloy would affect the activity of the catalyst layer 110. Thus, before the catalyst layer 110 is deposited on the first substrate surface, a catalyst carrier layer can be formed on the first substrate surface. Thus, the metal of the catalyst layer 110 cannot react with the first substrate surface, and the activity of the catalyst layer 110 would not be affected. The material of the catalyst carrier layer can be aluminum (Al), aluminum oxide ($Al_2O_3$), silicon oxide ($SiO_2$), or magnesium oxide (MgO). The thickness of the catalyst carrier layer ranges from about 1 nanometer to about 10 nanometers. In one embodiment, the catalyst carrier layer is an aluminum layer, and the thickness of the aluminum layer ranges from about 3 nanometer to about 7 nanometers. It is understood that the catalyst layer 110 and the catalyst carrier layer do not cover each through hole 109. The carbon source gas and the protective gas can still enter the chamber 101 by passing through the plurality of through holes 109 after forming the catalyst layer 110 and the catalyst carrier layer.

During step S3, in the chamber 101, the first substrate surface of the substrate 108 is away from the gas diffusing unit 104, the second substrate surface of the substrate 108 is in direct contact with the gas diffusing unit 104, and the substrate 108 covers the outlet 106.

During step S4, the carbon source gas and the protective gas are supplied to the gas diffusing unit 104 from the gas supplying pipe 103, and the carbon source gas and the protective gas can be supplied to the second substrate surface of the substrate 108 by passing through the outlet 106 of the gas diffusing unit 104. And then the carbon source gas and the protective gas enter inside of the chamber 101 and is in direct contact with the catalyst layer 110 by passing through the through holes 109 of the substrate 108.

During step S4, the first temperature is the growth temperature of the carbon nanotube array. The first temperature ranges from 600 degrees Celsius to 720 degrees Celsius. In one embodiment, the first temperature ranges from 620 degrees Celsius to 700 degrees Celsius. The composite structure is heated to the first temperature under a protective gas atmosphere, and then the carbon source gas and the protective gas mixture is supplied into the chamber 101, so that the carbon nanotube array is grown on the first substrate surface by chemical vapor deposition. The time for supplying the carbon source gas and the protective gas mixture ranges from about 10 minutes to about 40 minutes. The protective gas is an inert gas or nitrogen. The carbon source gas is a hydrocarbon compound, such as acetylene, ethylene, methane, ethane, or the like. During growing the carbon nanotube array on the first substrate surface, the pressure in the chamber 101 ranges from about 2 torrs to 8 torrs.

The carbon source gas, such as acetylene, is in direct contact with the catalyst layer 110 and pyrolyzed into carbon units (—C=C— or C) and hydrogen ($H_2$) due to the catalysis of the catalyst layer 110. When the hydrogen diffuses to the surface of the metal oxide catalyst nanoparticles, the metal oxide catalyst nanoparticles can be reduced to metal catalyst nanoparticles. Thus, the oxidized catalyst can be reduced and activated. Then, the carbon units are adsorbed on the surface of catalyst layer 110, thereby growing the carbon nanotube array on the first substrate surface of the substrate 108. In one embodiment, the protective gas is nitrogen, the carbon source gas is acetylene, the first temperature is about 700 degrees Celsius, and the pressure of the chamber 101 is about 5 torrs.

When the carbon source gas enters the chamber 101 through the plurality of through holes 109, the carbon source gas is in direct contact with the catalyst layer 110 to grow the carbon nanotube array. Thus, the carbon nanotube array can be grown on the first substrate surface of the substrate 108 without filling the carbon source gas in whole chamber 101, reducing waste of the carbon source gas.

In addition, in the prior art, in order to increase the size of the carbon nanotube array, a larger-sized substrate is generally used. Thus, it is difficult for the carbon source gas to sufficiently contact with the catalyst in the middle of the first substrate surface of the substrate 108 when some carbon nanotubes grow to a certain height, causing the carbon nanotubes of the carbon nanotube array to have different heights. However, in above method as shown in FIG. 6, the substrate 108 has the plurality of through holes 109, and the carbon source gas can enter inside of the chamber 101 from the plurality of through holes 109 and sufficiently contact with all of the catalyst on the first substrate surface. Thus, the carbon nanotubes of the carbon nanotube array prepared by the method as shown in FIG. 6 have the same height.

The steps S5 is optional steps and can be omitted. In the step S5, stopping supplying the carbon source gas to the second substrate surface, changing the temperature of the carbon nanotube array to the second temperature, and supplying the oxygen containing gas to the second substrate surface includes the following steps:

S51, stopping supplying the carbon source gas to the second substrate surface, continuously supplying the protective gas to the second substrate surface, and changing the temperature of the substrate 108 to the second temperature;

S52, supplying the oxygen containing gas to oxidize the carbon nanotube array, to form an oxidized carbon nanotube array; and S53, stopping supplying the oxygen containing gas and reducing the temperature of the oxidized carbon nanotube array.

During step S51, after growing the carbon nanotube array is finished, the supplying of the carbon source gas is stopped, and the supplying of the protective gas is continued. The second temperature can be in a range from about 500 degrees Celsius to about 800 degrees Celsius. The carbon nanotube array can be heated to the second temperature by changing the temperature of the chamber 101 to the second temperature. The pressure in the chamber 101 is still in a range from about 2 torrs to about 8 torrs. In one embodiment, the pressure in the chamber 101 is about 5 torrs.

During step S52, the oxygen containing gas can pass through the gas supplying pipe 103, the gas diffusing unit 104, and the through holes 109 of the substrate 108 to enter the chamber 101, so that the carbon nanotube array is oxidized at the second temperature. The flow rate of oxygen containing gas ranges from about 300 standard millimeters per minute (sccm) to 500 sccm. The oxygen containing gas can be pure oxygen or air. The reacting time between the carbon nanotube array and the oxygen containing gas is the time for oxidizing the carbon nanotube array by the oxygen containing gas and defined as an oxidizing time, and the oxidizing time is in a range from about 5 minutes to about 20 minutes.

During step S53, after oxidizing the carbon nanotube array is finished, the supplying of the oxygen containing gas is stopped, and the supplying of the protective gas is continued. The flow rate of the protective gas can be increased by providing more protective gas. After the temperatures of the oxidized carbon nanotube array and substrate 108 naturally fall below 400 degrees Celsius, the substrate 108 and the oxidized carbon nanotube array are slowly taken out of the chamber 101.

After step S5, the oxidized carbon nanotube array can further be separated from the substrate 108. For example, after the substrate 108 and the oxidized carbon nanotube array are taken out of the chamber 101, the oxidized carbon nanotube array can be separated from the substrate 108 by just shaking the substrate 108. When the substrate 108 stands up, the oxidized carbon nanotube array separates from the substrate 108 because of the weight of the carbon nanotube array itself. The oxidized carbon nanotube array can also be separated from the substrate 108 just by blowing on the oxidized carbon nanotube array, such as only blowing on the oxidized carbon nanotube array by mouth. Alternatively, the oxidized carbon nanotube array is more easily peeled from the substrate 108 using a knife or a tweezers than the non-oxidized carbon nanotube array. Furthermore, when the substrate 108 and the oxidized carbon nanotube array are taken out of the chamber 101, taking the substrate 108 and the oxidized carbon nanotube array out of the chamber 101 cannot too fast, and the speed of taking the substrate 108 and the oxidized carbon nanotube array out of the chamber 101 is greater than 0 cm/min and less than 100 cm/min. When the speed of taking the substrate 108 and the oxidized carbon nanotube array out of the chamber 101 is greater than or equal to 100 cm/min, the oxidized carbon nanotube array can fall off the substrate 108.

In one embodiment, the chamber 101 is heated to 700 degrees Celsius, the flow rate of the oxygen containing gas is 500 sccm, the oxidizing time ranges from about 9 minutes to about 10 minutes, and the oxidized carbon nanotube array and the substrate 108 are naturally cooled to 350 degrees Celsius. In one embodiment, the chamber 101 is heated to 800 degrees Celsius, the flow rate of the oxygen containing gas is 300 sccm, and the oxidizing time ranges from about 5 minutes to about 7 minutes. In one embodiment, the chamber 101 is heated to 500 degrees Celsius, the flow rate of the oxygen containing gas is 500 sccm, and the oxidizing time ranges from about 16 minutes to about 20 minutes. In one embodiment, the oxygen containing gas is supplied in the process of naturally reducing the temperatures of the oxidized carbon nanotube array, the flow rate of the oxygen containing gas is 500 sccm, and the oxidizing time ranges from about 13 minutes to about 15 minutes.

The carbon nanotube array includes a plurality of carbon nanotubes. Each carbon nanotube includes a top end, a bottom end, and a middle portion between the top end and the bottom end. In the process of growing the carbon nanotube array, for each carbon nanotube, first the top end grows, then the middle portion grows, and finally the bottom end grows. At the later growth stage of the carbon nanotube array, the catalytic activity of the catalyst layer 110 decreases, resulting in the bottom end having more defects than the top end and the middle portion. When the oxygen containing gas is supplied to the carbon nanotube array, the oxygen containing gas can contact the top end, the bottom end, and the middle portion of each carbon nanotube. However, it is easier for the oxygen containing gas to react with the bottom end than to react with the top end and the middle portion, because the bottom end has more defects than the top end and the middle portion. The reaction between the oxygen containing gas and the bottom end produces carbon dioxide and weakens the bonding force between each carbon nanotube and the first substrate surface of the substrate 108. The middle portion of each carbon nanotube only has a few defects, thus it is not easy for the middle portion to react with the oxygen containing gas, thereby keeping the integrity of the carbon nanotube array.

After the carbon nanotube array reacts with the oxygen containing gas for a period of time, the bonding force between the bottom of each carbon nanotube and the first substrate surface weakens by oxidizing the bottom end. Thus, the bottom end of each carbon nanotube can be separated from the substrate 108 just by simple mechanical vibration, such as just lightly shaking the substrate 108, just blowing on the oxidized carbon nanotube array, just tilting the substrate 108, just reversing the substrate 108, or lightly peeling with the knife or the tweezers. When the substrate 108 is tilted, an extending direction of the substrate 108 and a horizontal plane form an angle, and the angle is larger than or equal to 30 degrees. In one embodiment, the angle is equal to about 90 degrees. When the substrate 108 is tilted or reversed, the oxidized carbon nanotube array falls only by gravity. Thus, the structure of the carbon nanotube array cannot be destroyed, and an integrated carbon nanotube array can be obtained. Additionally, when the bottom end of each carbon nanotube is separated from the substrate 108, the catalyst layer 110 remains on the first substrate surface of the substrate 108. The carbon nanotube array contains a few catalyst metal particles or does not contain the catalyst metal particles after being separated from the substrate 108, thereby improving the quality or the purity of the carbon nanotube array.

The carbon nanotube array and the oxidized carbon nanotube array are the same except for bottom ends. The bottom ends of the carbon nanotube array are not be oxidized, and the oxidized carbon nanotube array are oxidized. Furthermore, the carbon nanotube array is a free-standing structure. The term "free-standing" includes, but not limited to, the carbon nanotube array that does not have to be supported by a substrate. For example, the free-standing carbon nanotube array can sustain the weight of itself when it is hoisted by a portion thereof without any significant damage to its structural integrity. So, if the free-standing carbon nanotube array is placed between two separate supporters, a portion of the free-standing carbon nanotube array, not in contact with the two supporters, would be suspended between the two supporters and yet maintain film structural integrity. The oxidized carbon nanotube array is also a free-standing structure. The oxidized carbon nanotube array separated from the substrate 108 is still a free-standing structure.

The second temperature, the oxidizing time, and the flow rate of the oxygen containing gas are related to the quality of the carbon nanotube array. When the quality of the carbon nanotube array is low, for example, the carbon nanotube array contains many defects and amorphous carbons, the second temperature can be appropriately decreased, the oxidizing time can be shortened, and the flow rate of the oxygen containing gas can be decreased. When the quality of the carbon nanotube array is high, for example, the carbon nanotube array substantially has no impurity, the second temperature can be appropriately increased, the oxidizing time can be prolonged, and the flow rate of the oxygen containing gas can be increased.

It can be understood that when the second temperature and the flow rate of the oxygen containing gas are constant, the oxidizing time cannot be too long or too short, as long as the oxidized carbon nanotube array can separated from the substrate 108 easily. When the oxidizing time is too long, the carbon nanotube array is can be seriously damaged and the height of the carbon nanotube array will be greatly reduced. When the oxidizing time is too short, separating the oxidized carbon nanotube array from the substrate 108 can be difficult.

The oxygen containing gas can pass through the gas supplying pipe 103 to enter the gas diffusing unit 104, and pass through the gas diffusing unit 104 and the through holes 109 of the substrate 108 to enter the chamber 101. In the process of entering the chamber 101, the oxygen containing gas contacts with and oxidizes the bottom end of each carbon nanotube. The oxygen containing gas can only contacts with and oxidizes the bottom end of each carbon nanotube by controlling the time for supplying the oxygen containing gas. Fox example, after oxidizing the bottom end of each carbon nanotube, the supplying of the oxygen containing gas is stopped. Thus, the chances of reacting the middle portion and top end of each carbon nanotube with the oxygen containing gas can be reduced, reducing the loss of the carbon nanotube array and improving the integrity of the carbon nanotube array.

In the prior art, the growth substrate for growing the carbon nanotube array is a continuous structure, the size of the carbon nanotube array grown on the growth substrate is larger, and the size of the carbon nanotube film formed by pulling the carbon nanotube array is also larger. When the carbon nanotube film is acted as a transparent conductive layer of a touch panel, the carbon nanotube film often needs to be cut, thereby causing the damage of the carbon nanotube film and increasing the production cost.

In the present invention, the substrate 108 includes a plurality of through holes 109, and the plurality of through holes 109 divide the substrate 108 into a plurality of regions. The size of each region determines the size of the carbon nanotube array and the size of the carbon nanotube film. The desired carbon nanotube film can be pulled directly out of the carbon nanotube array on the corresponding region. The carbon nanotube film cannot be damaged because of being cut, thereby reducing the production cost.

Figure 7:
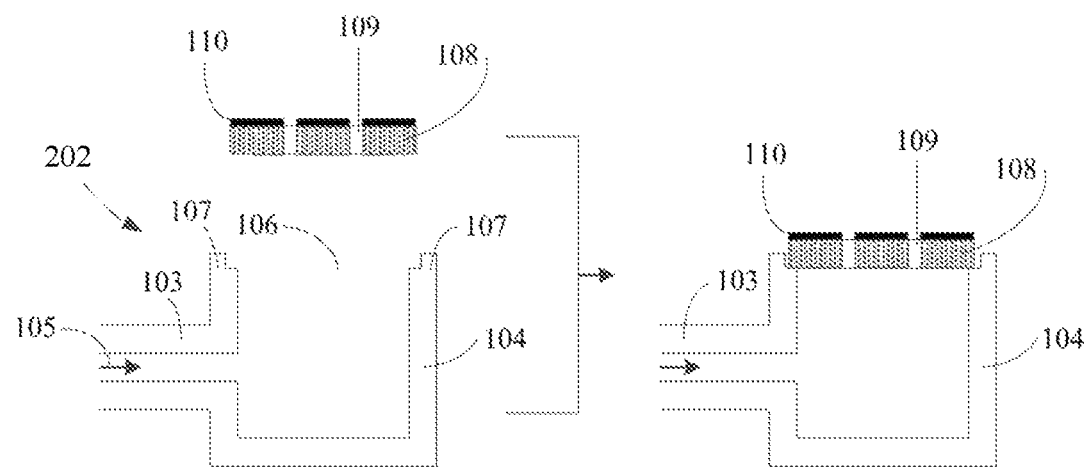
FIG. 7 is a schematic view of a second embodiment of connecting a gas supplying element with a substrate.

Referring to FIG. 7, a gas supplying element 202 of a second embodiment is shown. The gas supplying element 202 is similar to the gas supplying element 102 of the first embodiment above except that each of at least the first sidewall 1043 and the second sidewall 1045 has a stair. The stair is in the space 1047 and used for supporting the substrate 108. The stair is adjacent to one end of each of the first sidewall 1043 and the second sidewall 1045. The substrate 108 can be located on and fixed by the stairs of the first sidewall 1043 and the second sidewall 1045.

Figure 8:
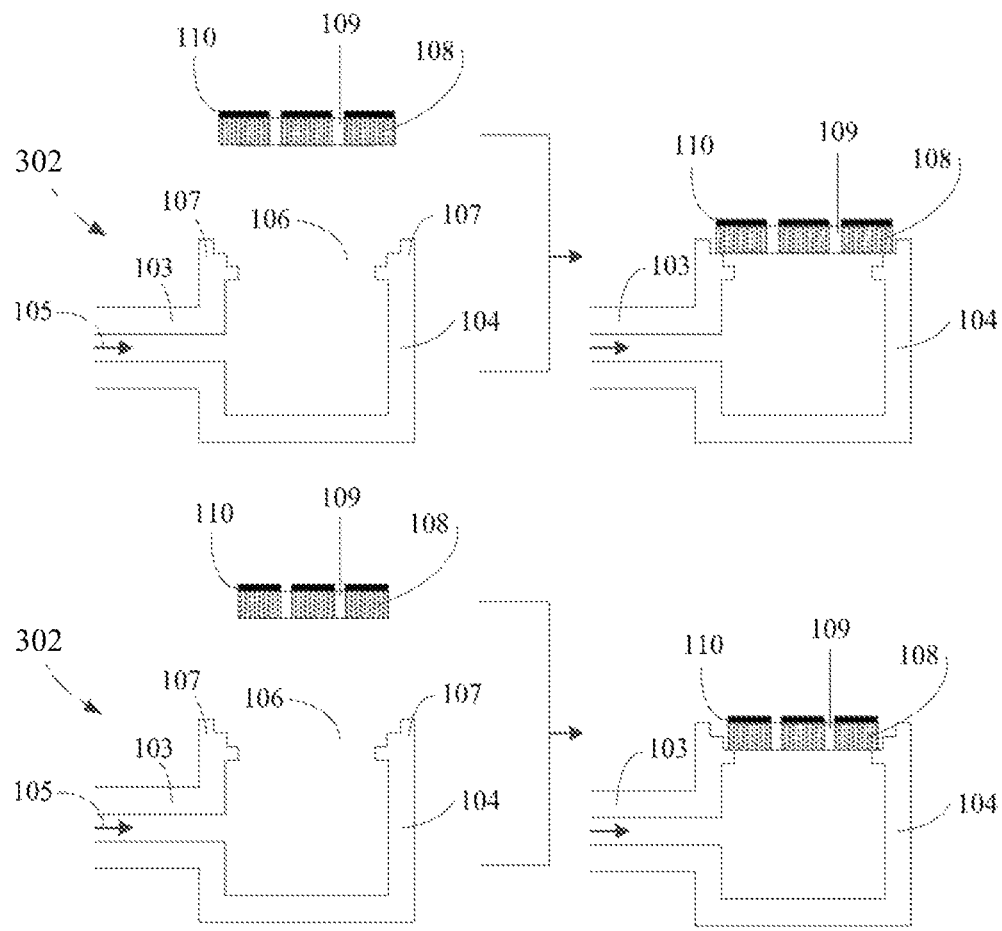
FIG. 8 is a schematic view of a third embodiment of connecting a gas supplying element with a substrate.

Referring to FIG. 8, a gas supplying element 302 of a third embodiment is shown. The gas supplying element 302 is similar to the gas supplying element 202 of the second embodiment above except that each of at least the first sidewall 1043 and the second sidewall 1045 has a plurality of stairs. The plurality of stairs can be used for supporting a plurality of substrates 108 with different sizes, thereby meeting different production needs.

Figure 9:
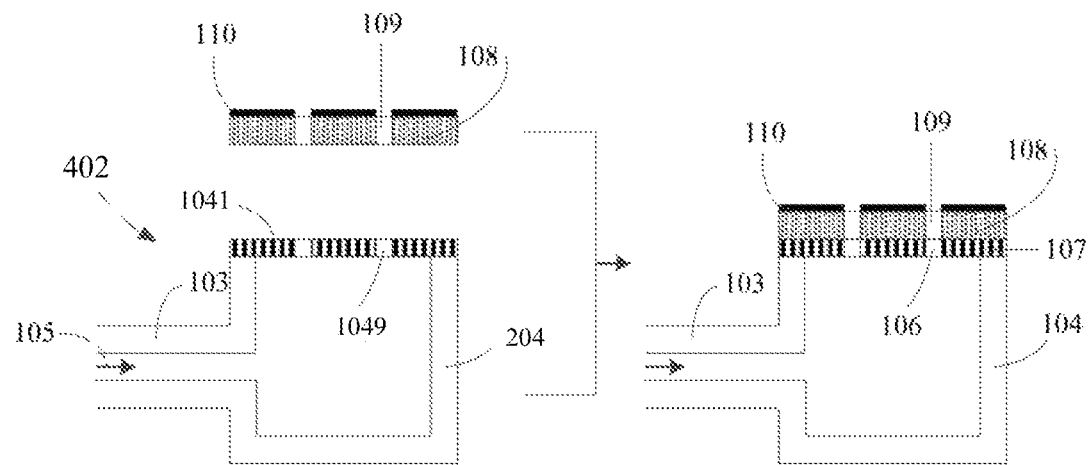
FIG. 9 is a schematic view of a forth embodiment of connecting a gas supplying element with a substrate.

Referring to FIG. 9, a gas supplying element 402 of a fourth embodiment is shown. The gas supplying element 402 is similar to the gas supplying element 102 of the first embodiment above except that the gas diffusing unit 204 further includes a plate 1041 covering the outlet 106, and the plate 1041 has a plurality of plate through holes 1049 spaced from each other. The plate 1041 is used for supporting the substrate 108. The material of the plate 1041 is not limited. In one embodiment, the plate is quartz mesh, and plurality of plate through holes 1049 is correspond to the plurality of through holes 109 of the substrate 108 one to one. The gas in the gas diffusing unit 204 can enter inside of the chamber 101 by passing through the plurality of plate through holes 1049 of the gas diffusing unit 204 and the plurality of through holes 109 of the substrate 108.

Figure 10:
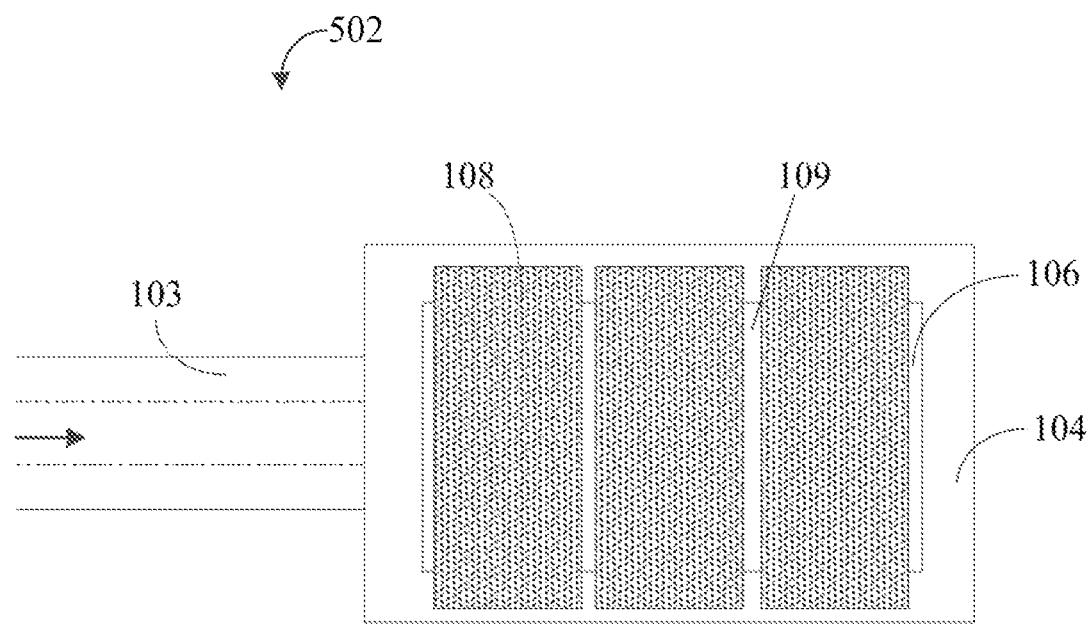
FIG. 10 is a schematic view of a fifth embodiment of connecting a gas supplying element with a substrate.
Figure 11:
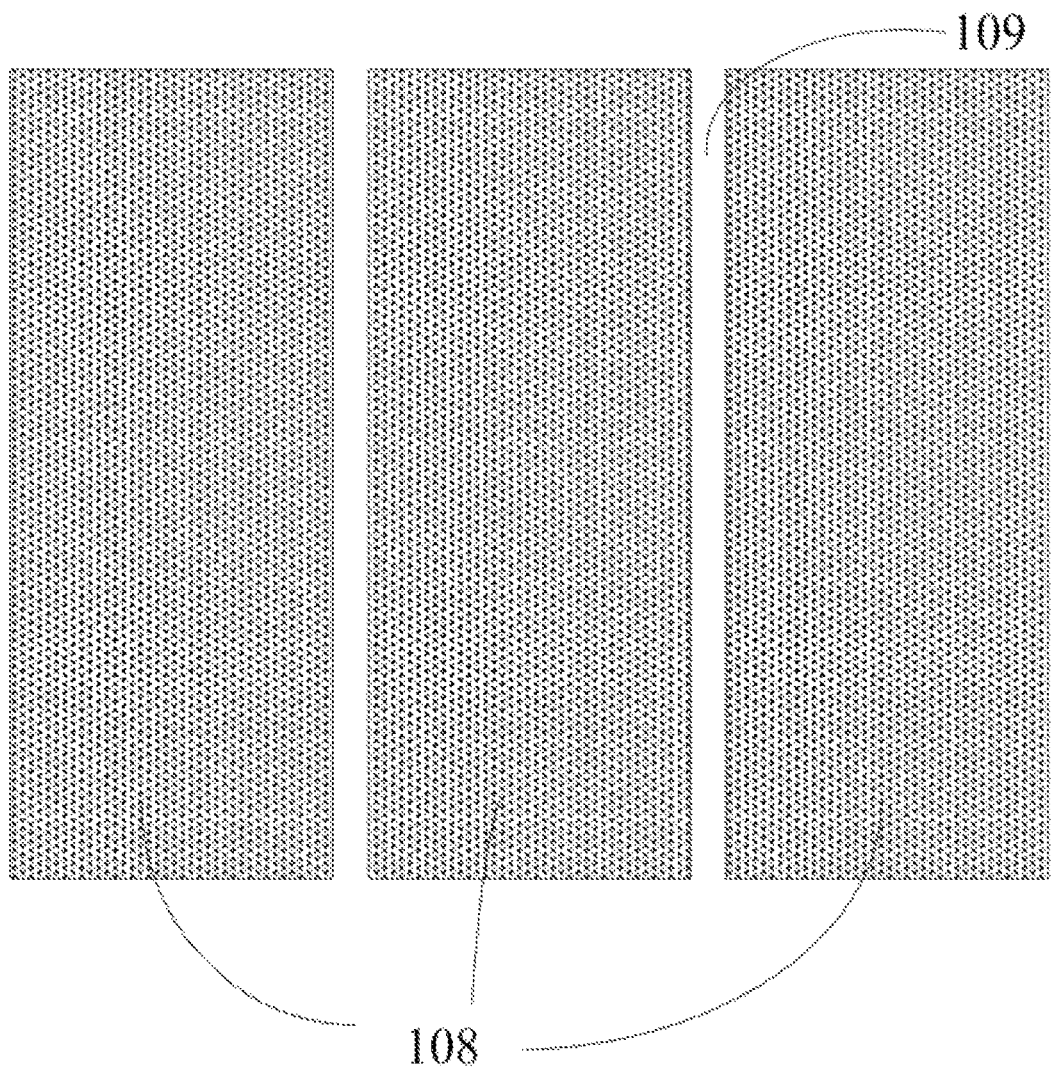
FIG. 11 is a schematic view of the fifth embodiment of a substrate.

Referring to FIG. 10, a gas supplying element 502 of a fifth embodiment is shown. The gas supplying element 502 is similar to the gas supplying element 102 of the first embodiment above except that the gas supplying element 502 includes a plurality of the substrates 108 spaced from each other, and the length of each substrate 108 is greater than the width of the outlet 106. Each substrate 108 is across the outlet 106 and located on the gas diffusing unit 104. In one embodiment, the length direction of each substrate 108 is perpendicular to the length direction of the outlet 106. Each of the plurality of through holes 109 is formed by the distance between two adjacent substrates 108, as shown in FIG. 11. Thus, multiple independent carbon nanotube arrays can simultaneously be prepared.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may comprise some indication in reference to certain steps. However, the indication used is only to be viewed for identification purposes and not as a suggestion as to an order for the steps.

What is claimed is:

1. A method for making a carbon nanotube array, the method comprising:
    providing a substrate, wherein the substrate defines a plurality of through holes and has a first substrate surface and a second substrate surface opposite to the first substrate surface, and the plurality of through holes is spaced apart from each other and extends from the first substrate surface to the second substrate surface;
    depositing a catalyst carrier layer on the first substrate surface, wherein the catalyst carrier layer is an aluminum layer, and a thickness of the aluminum layer ranges from about 3 nanometer to about 7 nanometers;
    depositing a catalyst layer on the catalyst carrier layer;
    providing a gas diffusing unit in a chamber, wherein the gas diffusing unit is a hollow structure and defines a space, a hole and an outlet;
    providing a gas supplying pipe in the chamber, wherein the gas supplying pipe comprises a first end and a second end opposite to the first end, the first end extends out of the chamber, and the second end is in the chamber and connected to the hole;
    placing the substrate in the chamber and on the gas diffusing unit to cover the outlet; and
    growing a carbon nanotube array on the first substrate surface by supplying a carbon source gas and a protective gas into the space via the gas supplying pipe, and heating the substrate.

2. The method of claim 1, wherein the gas diffusing unit comprises a bottom wall and a sidewall, the sidewall defines the hole, and the outlet is opposite to the bottom wall.

3. The method of claim 2, wherein the sidewall form a cubic, a circular, or a trapezoid.

4. The method of claim 1, wherein a shape of the gas diffusing unit is cubic.

5. The method of claim 1, further comprising stopping supplying the carbon source gas and supplying an oxygen containing gas into the space via the gas supplying pipe after growing the carbon nanotube array.

6. The method of claim 5, wherein a flow rate of the oxygen containing gas ranges from about 300 sccm to 500 sccm.

7. The method of claim 1, wherein a pressure in the chamber is in a range from about 2 torrs to about 8 torrs during growing the carbon nanotube array.

8. A method for making a carbon nanotube array, the method comprising:
    providing a substrate, wherein the substrate defines a plurality of through holes and has a first substrate surface and a second substrate surface opposite to the first substrate surface, and the plurality of through holes is spaced apart from each other and extends from the first substrate surface to the second substrate surface;

depositing a catalyst layer on the first substrate surface;

providing a gas diffusing unit in a chamber, wherein the gas diffusing unit is a hollow structure and defines a space, a hole and an outlet;

providing a gas supplying pipe in the chamber, wherein the gas supplying pipe comprises a first end and a second end opposite to the first end, the first end extends out of the chamber, and the second end is in the chamber and connected to the hole;

placing the substrate on the gas diffusing unit to cover the outlet;

growing a carbon nanotube array in the chamber and on the first substrate surface by supplying a carbon source gas and a protective gas into the space via the gas supplying pipe, and heating the substrate; wherein the carbon nanotube array comprises a plurality of carbon nanotubes, each of the plurality of carbon nanotubes comprises a bottom end bonded to the first substrate surface;

oxidizing the bottom end by an oxygen containing gas, wherein a flow rate of the oxygen containing gas ranges from about 300 sccm to 500 sccm; and separating the carbon nanotube array from the substrate.

9. The method of claim 8, further comprising depositing a catalyst carrier layer on the first substrate surface before depositing the catalyst layer, and a material of the catalyst carrier layer is selected from the group consisting of aluminum, aluminum oxide, silicon oxide, and magnesium oxide.

10. The method of claim 8, wherein the oxidizing the bottom end comprises:

stopping supplying the carbon source gas;

changing a temperature of the carbon nanotube array to a second temperature; and supplying the oxygen containing gas into the space via the gas supplying pipe.

11. The method of claim 10, wherein the temperature is in a range from about 500 degrees Celsius to about 800 degrees Celsius.

12. The method of claim 10, wherein a time for oxidizing the bottom end is in a range from about 5 minutes to about 20 minutes.

13. The method of claim 10, wherein a pressure in the chamber is in a range from about 2 torrs to about 8 torrs during oxidizing the bottom end.

14. The method of claim 8, wherein the separating the carbon nanotube array from the substrate further comprises applying a force to one of the carbon nanotube array and the substrate.

15. A method for making a carbon nanotube array, the method comprising:

providing a substrate, wherein the substrate defines a plurality of through holes and has a first substrate surface and a second substrate surface opposite to the first substrate surface, and the plurality of through holes is spaced apart from each other and extends from the first substrate surface to the second substrate surface;

depositing a catalyst layer on the first substrate surface;

providing a gas diffusing unit in a chamber, wherein the gas diffusing unit is a hollow structure and defines a space, a hole and an outlet;

providing a gas supplying pipe in the chamber, wherein the gas supplying pipe comprises a first end and a second end opposite to the first end, the first end extends out of the chamber, and the second end is in the chamber and connected to the hole;

placing the substrate in the chamber, wherein the substrate is suspended on the outlet to cover the outlet; and growing a carbon nanotube array on the first substrate surface by supplying a carbon source gas and a protective gas into the space via the gas supplying pipe, and heating the substrate.

16. The method of claim 15, wherein the substrate is in direct contact with the gas diffusing unit.

17. The method of claim 15, wherein both the first substrate surface and the second substrate surface cover the outlet.

18. The method of claim 15, wherein the second substrate surface is in direct contact with the gas diffusing unit.

19. The method of claim 15, further comprising stopping supplying the carbon source gas and supplying an oxygen containing gas into the space via the gas supplying pipe after growing the carbon nanotube array.

20. The method of claim 19, wherein a flow rate of the oxygen containing gas ranges from about 300 sccm to 500 sccm.

* * * * *